(12) United States Patent
Lee

(10) Patent No.: US 7,687,394 B2
(45) Date of Patent: Mar. 30, 2010

(54) METHOD FOR FORMING INTER-LAYER DIELECTRIC OF LOW DIELECTRIC CONSTANT AND METHOD FOR FORMING COPPER WIRING USING THE SAME

(75) Inventor: Jae Suk Lee, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 637 days.

(21) Appl. No.: 11/604,920

(22) Filed: Nov. 27, 2006

(65) Prior Publication Data

US 2007/0128853 A1    Jun. 7, 2007

(30) Foreign Application Priority Data

Dec. 5, 2005    (KR) ............. 10-2005-0117573

(51) Int. Cl.
*H01L 21/4763* (2006.01)
(52) U.S. Cl. ............................ 438/637; 257/E23.14
(58) Field of Classification Search .......... 257/E23.011, 257/E23.145
See application file for complete search history.

(56) References Cited

U.S. PATENT DOCUMENTS

| 6,297,554 | B1 * | 10/2001 | Lin ................. 257/752 |
| 6,396,119 | B1 * | 5/2002 | Givens ............. 257/522 |
| 6,423,630 | B1 * | 7/2002 | Catabay et al. ...... 438/624 |
| 6,905,938 | B2 * | 6/2005 | Yang et al. ......... 438/422 |
| 7,138,329 | B2 * | 11/2006 | Lur et al. .......... 438/619 |
| 7,364,964 | B2 * | 4/2008 | Izumi .............. 438/240 |
| 7,449,407 | B2 * | 11/2008 | Lur et al. .......... 438/619 |
| 2004/0097065 | A1 * | 5/2004 | Lur et al. ......... 438/619 |
| 2004/0183203 | A1 * | 9/2004 | Meagley et al. ..... 257/774 |
| 2004/0232552 | A1 * | 11/2004 | Wang et al. ........ 257/758 |
| 2005/0051864 | A1 * | 3/2005 | Lee et al. ......... 257/506 |

(Continued)

FOREIGN PATENT DOCUMENTS

KR    10-2001-0038593 A    5/2001

OTHER PUBLICATIONS

Geun Taek Lee and Mun Hui Lee; "Method of Forming Low Permittivity Interlayer Dielectric in Semiconductor Device"; Korean Patent Abstracts; Publication No. 1020010038593 A; Publication Date: May 15, 2001; Korean Intellectual Property Office, Republic of Korea.

(Continued)

*Primary Examiner*—Thao P. Le
(74) *Attorney, Agent, or Firm*—The Law Offices of Andrew D. Fortney; Andrew D. Fortney

(57) ABSTRACT

A method for forming a dielectric layer having a low dielectric constant and a method for forming copper wiring using the same are provided. In the method for forming a dielectric, an etch stop layer and a first dielectric are sequentially formed on a semiconductor substrate. Next, the first dielectric is selectively etched to form a pattern, and a second dielectric is formed thereon. Here, the second dielectric may be formed using a plasma enhanced chemical deposition method to have pores or voids therein. Then, the dielectric is planarized and a damascene copper wiring is formed. Since the dielectric includes pores or voids, it may have a very low dielectric constant, which results in an improvement in RC delay.

16 Claims, 4 Drawing Sheets

U.S. PATENT DOCUMENTS

2005/0051865 A1* 3/2005 Lee et al. .................... 257/506
2006/0035457 A1* 2/2006 Carter et al. ................ 438/624
2007/0090531 A1* 4/2007 Offenberg et al. ........... 257/758
2007/0264819 A1* 11/2007 Offenberg et al. ........... 438/623

OTHER PUBLICATIONS

Korean Office Action dated Sep. 26, 2006; Korean Patent Application No. 10-2005-0117573; Korean Intellectual Property Office, Republic of Korea.

* cited by examiner

METHOD FOR FORMING INTER-LAYER DIELECTRIC OF LOW DIELECTRIC CONSTANT AND METHOD FOR FORMING COPPER WIRING USING THE SAME

BACKGROUND OF THE INVENTION

1. Field of the Invention

The present invention relates to a manufacturing technique of a semiconductor device, and more particularly to a method for forming a dielectric layer (such as an inter-layer dielectric) suitable to reduce a dielectric constant thereof and/or a method for forming a copper wiring.

2. Description of the Related Art

A semiconductor manufacturing process may be classified into a Front End of the Line (FEOL) process for forming transistors on a semiconductor substrate and a Back End of the Line (BEOL) process for forming wiring layers.

A wiring technique is a technique of embodying a path of power supply and signal transmission circuits by connecting separate transistors to each other in a semiconductor integrated circuit.

A resistance R of a metal wiring and a capacitance C of an inter-layer dielectric cause a RC delay in a semiconductor device. Accordingly, so as to drive the semiconductor device at high speed, the resistance R of a metal wiring and the capacitance C of an inter-layer dielectric should be reduced.

In recent years, in order to improve the RC delay in the semiconductor device, the resistance of the metal wiring has been lowered by using copper (Cu), which has a low specific resistance, as a metal wiring of the semiconductor device. In addition, an insulator layer having a low dielectric constant has been used to reduce parasitic capacitances between metal wirings.

FIG. 1 is a cross-sectional view showing an inter-layer dielectric having a low dielectric constant according to the related art. FIG. 2 is a cross-sectional view showing a damascene structure for forming a copper wiring according to the related art.

Referring to FIG. 1, to form a wiring using a damascene process, an insulating layer has a structure in which an etch stop layer 4, an inter-layer dielectric 6 having a low dielectric constant, and an oxide layer 8 are sequentially formed on a lower copper wiring 2.

Next, the oxide layer 8 and the inter-layer dielectric 6 are selectively etched to form a via hole 11 and a trench 13 as shown in FIG. 2, and a copper wiring is then formed in the via hole 11 and the trench 13.

As described earlier, when a low dielectric layer is used as the inter-layer dielectric, the dielectric constant thereof may be reduced to a value of less than approximately 3.6, thereby reducing the RC delay in a wiring of the semiconductor device. However, recently, in order to further reduce the RC delay, the development of technology for further reducing a dielectric constant of the inter-layer dielectric has been in progress.

SUMMARY OF THE INVENTION

Accordingly, the present invention is directed to a method for forming a dielectric layer having a low dielectric constant, and a method for forming a copper wiring using the same, that substantially obviate one or more problems due to limitations and disadvantages of the related art.

Accordingly, an object of the present invention is to provide a method for forming a dielectric layer having a low dielectric constant in order to reduce an RC delay.

It is another object of the present invention to provide a method for forming a copper wiring using the method for forming a dielectric layer having a low dielectric constant.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a method for forming a dielectric layer, comprising: sequentially forming an etch stop layer and a first dielectric on a semiconductor substrate; selectively etching the first dielectric to form a first dielectric pattern; covering the first dielectric pattern with a second dielectric and forming at least one void between first dielectric pattern structures; and planarizing at least the second dielectric.

In another aspect of the present invention, there is provided a method for forming a copper wiring, comprising: sequentially forming an etch stop layer and a first dielectric on a semiconductor substrate; selectively etching the first dielectric to form a first dielectric pattern; covering the first dielectric pattern with a second dielectric and forming at least one void between adjacent first dielectric pattern structures; and planarizing at least the second dielectric to form a dielectric layer; forming a via hole and a trench in the dielectric layer; and forming the copper wiring in the via hole and the trench.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 3A through 3H are cross-sectional views of structure(s) in an inter-layer dielectric, for describing a method for forming an inter-layer dielectric and/or copper wiring according to the present invention.

Figure 1:
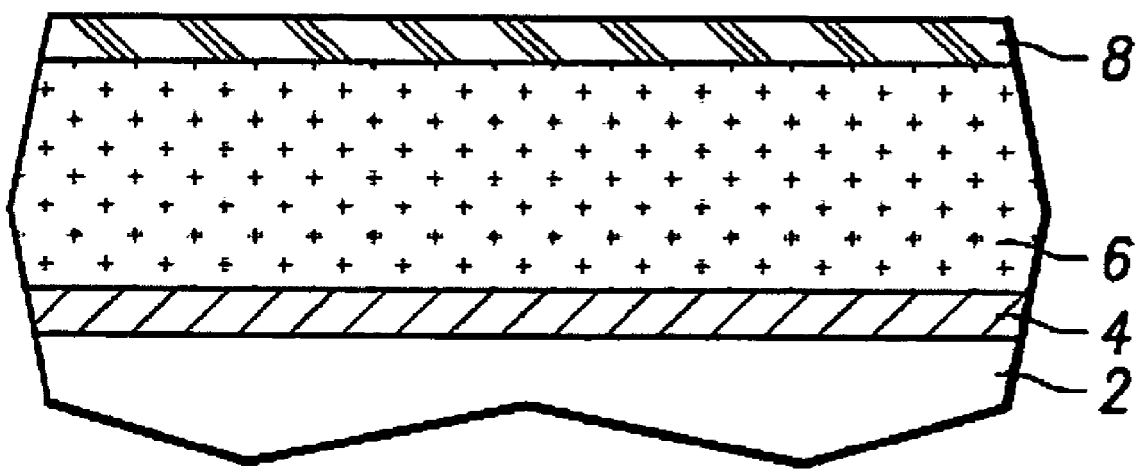
FIG. 1 is a cross-sectional view showing an inter-layer dielectric of a low dielectric constant according to the related art.
Figure 2:
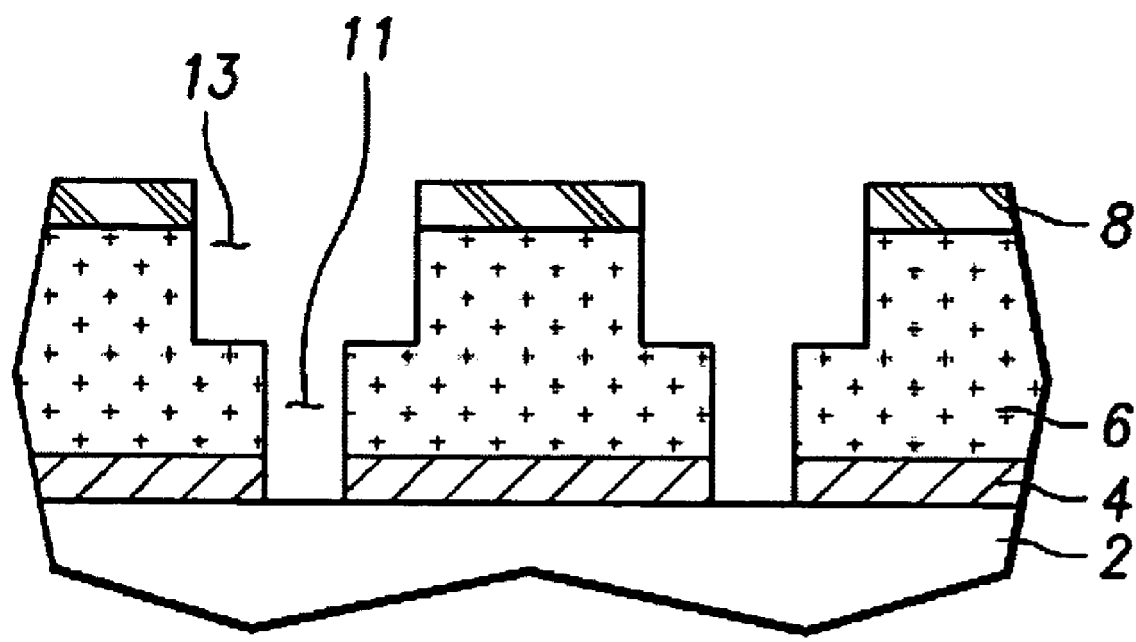
FIG. 2 is a cross-sectional view showing a damascene structure for forming a copper wiring according to the related art.
Figure 3A:
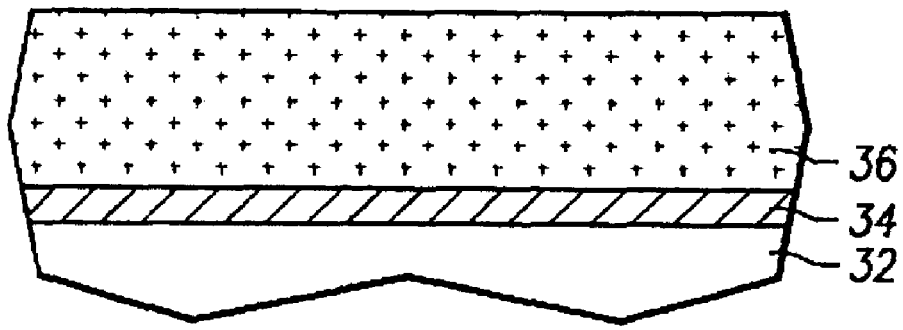
FIGS. 3A through 3H are cross-sectional views of a dielectric structure for describing a method for forming a dielectric layer and/or copper wiring according to the present invention.

Referring to FIG. 3A, an etch stop layer 34 and a first (inter-layer) dielectric 36 are sequentially formed on a lower copper wiring 32, which is formed on a semiconductor substrate.

The etch stop layer 34 may comprise a silicon nitride layer (SiN) or a silicon carbonizing layer (e.g., a silicon carbide, or SiC). SiOC or Fluorine doped Silicate Glass (FSG) can be used as The first inter-layer dielectric 36 may comprise silicon oxycarbide (SiOC), hydrogenated silicon oxycarbide (SiOC), a silicon-rich oxide (SRO), and/or fluorine doped silicate glass (FSG). Thus, a combined layer comprising or formed from SRO (Silicon Rich Oxide)/FSG/SRO can be used as the first inter-layer dielectric 36. On the other hand, a double layer comprising or made from FSG/SRO may be used as the first inter-layer dielectric 36.

Figure 3B:
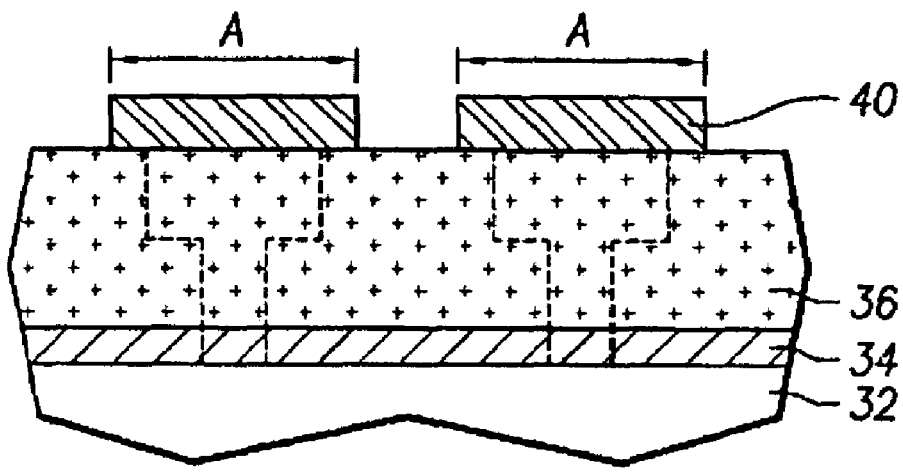

Next, as shown in FIG. 3B, a photo resist layer is formed on a region A corresponding to a location where a via hole and a trench are to be formed later, and the photo resist layer is then patterned by a photolithography process including exposure and developing processes, thereby forming a photo resist pattern 40.

Figure 3C:
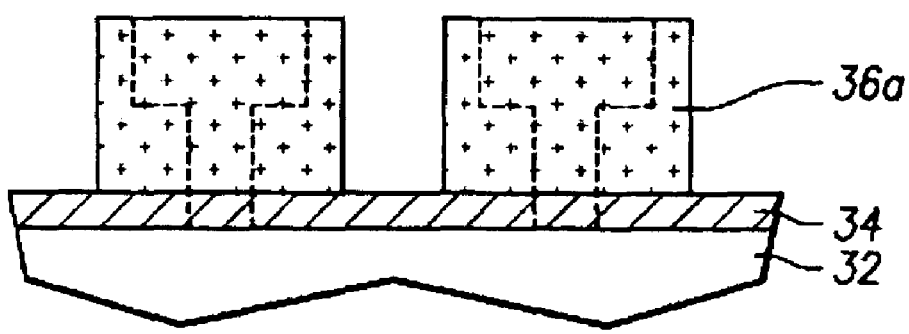

Further, the first inter-layer dielectric 36 is patterned using the photo resist pattern 40 as an etch mask to form a first inter-layer dielectric pattern 36a in the region A, as shown in FIG. 3C. In one embodiment, patterning the first inter-layer dielectric 36 comprises plasma etching, reactive ion etching (RIE), and/or dry etching.

Figure 3D:
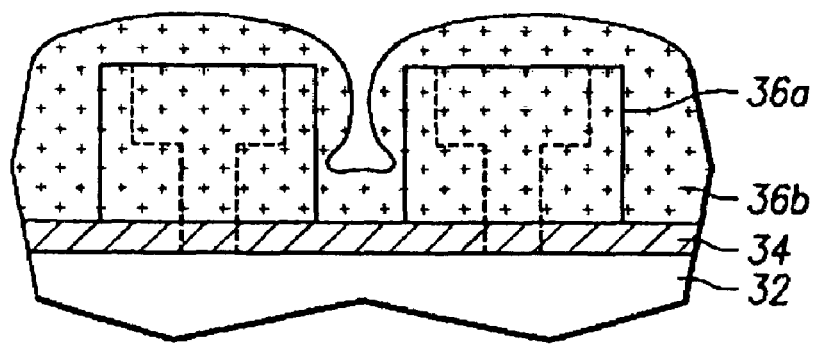

Then, as shown in FIG. 3D, a second inter-layer dielectric 36b is formed to cover the etch stop layer 34 and the first inter-layer dielectric 36a. Forming the second inter-layer dielectric 36 generally comprises conformally depositing the second inter-layer dielectric 36, by a process such as chemical vapor deposition (CVD). The second inter-layer dielectric 36 may comprise the same material(s) as that or those of the first inter-layer dielectric 36a.

In an embodiment of the present invention, the second inter-layer dielectric 36b can be formed using a Plasma Enhanced Chemical Vapor Deposition (referred to as 'PECVD' hereinafter) process. The PECVD process is a technique which discharges a source gas to generate active ions and radicals in a plasma in order to accelerate a chemical reaction at a surface of a substrate, thereby forming a thin film. The second inter-layer dielectric 36b covers the first inter-layer dielectric pattern 36a and the etch stop layer 34 by the PECVD process.

Figure 3E:
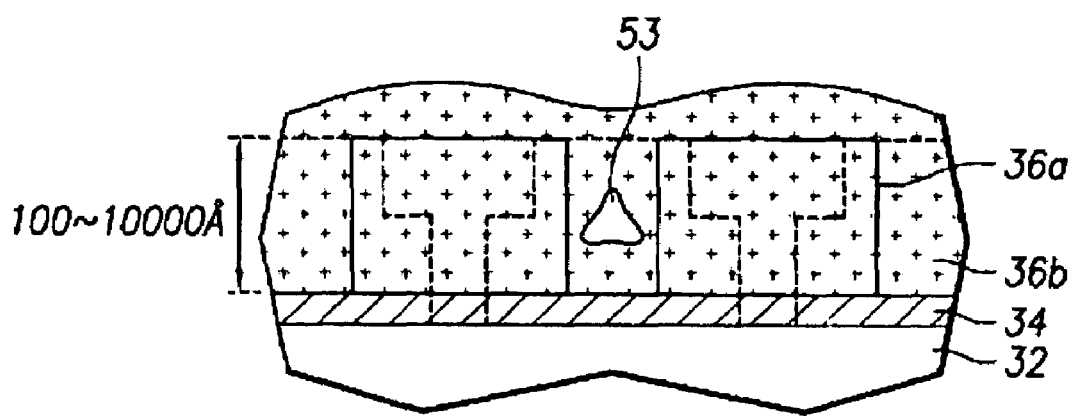

As the first inter-layer dielectric pattern 36a is covered with the second inter-layer dielectric 36b, a void 53 can be generated or formed between the first inter-layer dielectric pattern structures 36a. Such voids may be more likely to form when the first dielectric pattern structures 36a have a great aspect ratio as shown in FIG. 3E (e.g., at least 2, 2.5 or 3) due to a gap fill characteristic of the PECVD process. In general, the gap fill characteristic(s) of PECVD tend to be not as good as other deposition techniques (e.g., low pressure CVD, etc.). An inside of the void 53 may be filled with air (the dielectric constant of which is 1) or the atmosphere within the plasma deposition chamber during formation of the second inter-layer dielectric 36b (which may comprise one or more feed gases for formation of the second inter-layer dielectric 36b and which may be under a low-pressure or vacuum condition).

In some embodiments of the present invention, by adjusting PECVD process conditions, at least two (i.e., preferably, a plurality of) voids 53 are formed between adjacent first inter-layer dielectric pattern structures 36a.

Figure 3F:
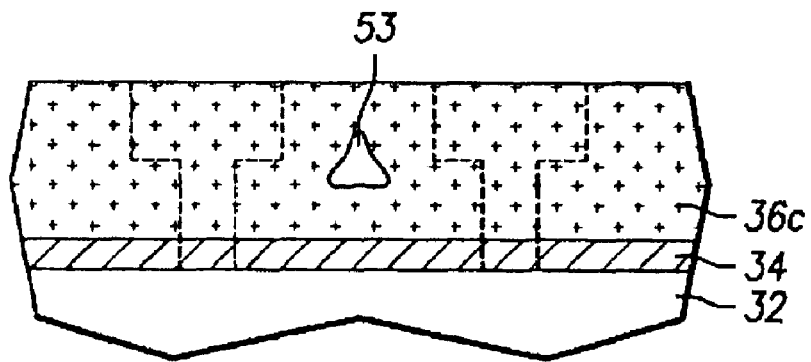

After forming the second inter-layer dielectric 36b and the voids 53, and referring now to FIGS. 3E-3F, an upper surface of the second inter-layer dielectric 36b is polished using a chemical mechanical polishing (CMP) process. In one embodiment, polishing is performed until an upper surface of the first inter-layer dielectric 36a is exposed. Alternatively, when first dielectric pattern 36a has a height or thickness that may be insufficient for the final thickness of the interlayer dielectric, the second inter-layer dielectric 36b may be polished until the final thickness is achieved. Accordingly, the planarized second inter-layer dielectric 36b (or the planarized combination of first and second dielectrics 36a and 36b) may have a thickness ranging from 100 to 10000 Å, preferably 1000 or 2000 Å to 6000 or 8000 Å. Alternatively, such thickness ranges may represent a target thickness for an inter-layer dielectric 36c as shown in FIG. 3F.

Although the second inter-layer dielectric 36b is planarized to form the inter-layer dielectric 36c, as shown in FIG. 3F, the voids 53 still remain between regions A for forming copper wiring in the inter-layer dielectric 36c.

Because the dielectric constant of air (or vacuum) is about 1 or perhaps lower, the dielectric constant of the inter-layer dielectric 36c having voids therein may be lower than an otherwise identical dielectric layer formed from just the first dielectric layer 36a (e.g., in comparison with a case in which only a low dielectric layer is used).

The following is an exemplary damascene process for forming a copper wiring using an inter-layer dielectric of low dielectric constant and including voids (which may have air therein) in order to obtain a low dielectric constant.

Figure 3G:
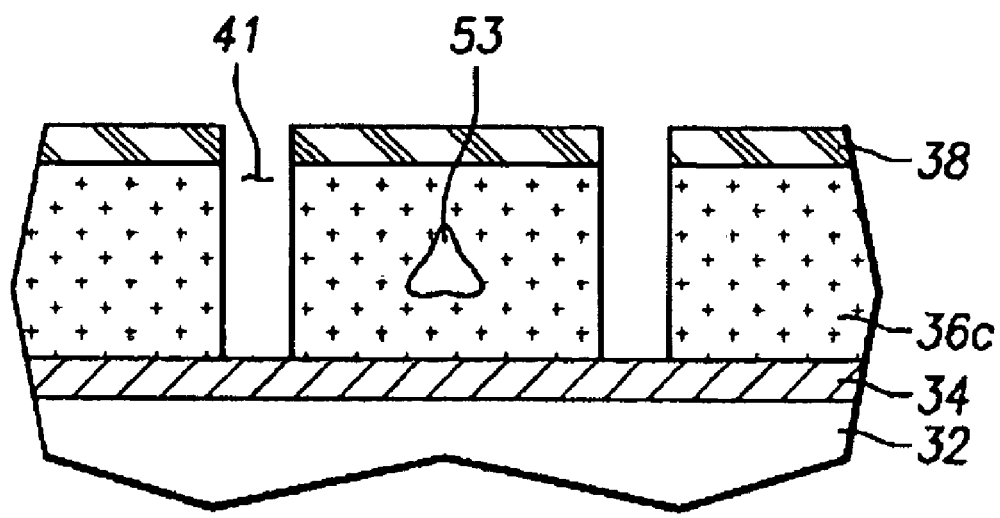

With reference to FIG. 3G, after a formation of the inter-layer dielectric layer 36c, an oxide layer 38 (or other dielectric layer, such as silicon nitride) may be formed on the inter-layer dielectric 36c. Next, the layer 38 and the inter-layer dielectric 36c are patterned until etch stop layer 34 is exposed to form a via hole 41.

Figure 3H:
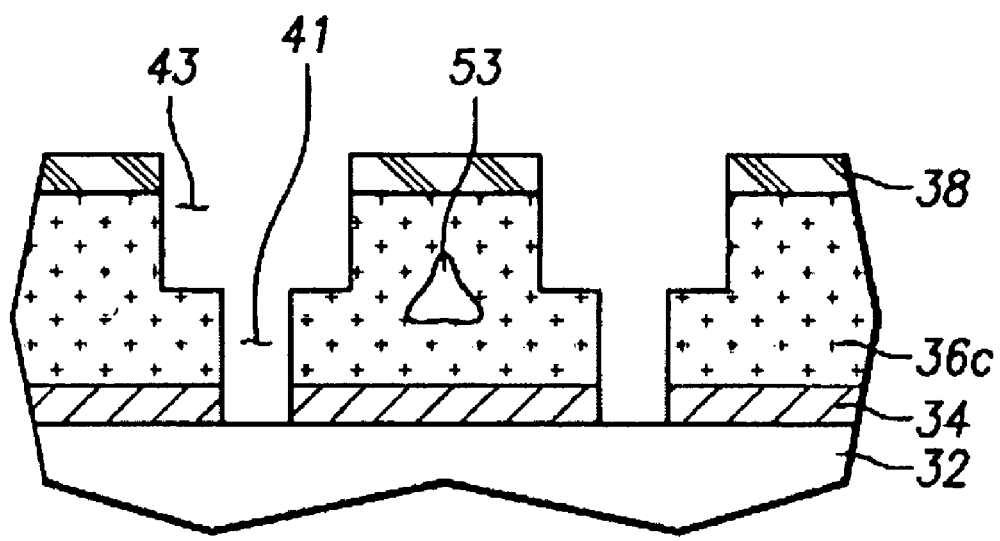

Then, as shown in FIG. 3H, the oxide layer 38 and the inter-layer dielectric 36c are selectively etched to a predetermined depth (e.g., the center) of the inter-layer dielectric 36c to form a trench 43 having a width greater than that of the via hole.

Thereafter, the etch stop layer 34 corresponding to the via hole 41 is removed to expose a lower copper wiring 32. Subsequently, a copper seed layer (not shown) is formed inside the via hole 41 and the trench 43 (e.g., by sputtering), and a copper layer is then formed in the via hole 41 and the trench 42 and on an upper surface of the oxide layer 38 via a deposition technique such as electroplating (e.g., on the copper seed layer).

As is clear from the forgoing embodiments, when forming a copper wiring using techniques of the present invention, the inter-layer dielectric includes voids, with the result that the dielectric constant may be significantly reduced, which results in a minimization of RC-delay effects.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for forming a copper wiring, comprising:
sequentially forming an etch stop layer and a first dielectric on a semiconductor substrate;
selectively etching the first dielectric to form a first dielectric pattern, wherein the first dielectric pattern has a greater width than that of a region in which copper wiring is subsequently formed;

covering the first dielectric pattern with a second dielectric and forming at least one void between adjacent first dielectric pattern structures, wherein the void is below an uppermost surface of the first dielectric pattern;

planarizing at least the second dielectric to form a dielectric layer;

forming a via hole and a trench in the dielectric layer between the voids; and forming the copper wiring in the via hole and the trench such that the copper wiring has an exposed upper surface.

2. The method according to claim 1, wherein forming the second dielectric comprises a plasma chemical vapor deposition method.

3. The method according to claim 2, wherein the first and second dielectrics comprise substantially a same material.

4. The method according to claim 3, wherein the material comprises a member selected from the group consisting of silicon oxycarbide (SiOC), a fluorosilicate glass (FSG), a silicon-rich oxide (SRO)/FSG/SRO trilayer, and a SRO/FSG bilayer.

5. The method according to claim 1, wherein the etch stop layer comprises a silicon nitride layer or a silicon carbide layer.

6. The method according to claim 1, wherein each of the first and second dielectrics has a thickness ranging from 100 to 10,000 Å.

7. The method according to claim 1, wherein the combination of the first and second dielectrics has a thickness of from 1000 to 10,000 Å.

8. The method according to claim 1, wherein forming the second dielectric comprises a plasma enhanced chemical vapor deposition (CVD) process.

9. The method according to claim 1, comprising planarizing the first and second dielectrics.

10. The method according to claim 1, further comprising patterning a photoresist on the first dielectric through a photolithography process prior to selectively etching the first dielectric.

11. The method according to claim 1, wherein the first dielectric pattern has an aspect ratio of from 2.0 to 3.0.

12. The method according to claim 1, further comprising forming a third dielectric on the dielectric layer.

13. The method according to claim 1, wherein forming the copper wiring comprises forming a copper seed layer inside the via hole and the trench by a sputtering process.

14. The method according to claim 13, further comprising electroplating copper on the copper seed layer to form the copper wiring.

15. The method according to claim 14, wherein the copper wiring is formed in the via hole, in the trench and on an uppermost surface of the third dielectric.

16. The method according to claim 1, wherein the via hole and the trench are formed in the first dielectric.

* * * * *